(12) United States Patent
Koss et al.

(10) Patent No.: US 8,258,776 B2
(45) Date of Patent: Sep. 4, 2012

(54) SENSOR SYSTEM AND METHOD

(75) Inventors: Sebastian Koss, Munich (DE); Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/005,158

(22) Filed: Jan. 12, 2011

(65) Prior Publication Data
US 2011/0101973 A1 May 5, 2011

Related U.S. Application Data

(63) Continuation of application No. 12/185,385, filed on Aug. 4, 2008, now Pat. No. 7,915,885.

(51) Int. Cl.
*G01R 15/18* (2006.01)
(52) U.S. Cl. .................................. 324/117 R; 324/244
(58) Field of Classification Search .............. 324/117 R, 324/244
See application file for complete search history.

(56) References Cited

U.S. PATENT DOCUMENTS

| | | | | |
|---|---|---|---|---|
| 4,794,326 A | * | 12/1988 | Friedl | 324/117 R |
| 5,041,780 A | * | 8/1991 | Rippel | 324/117 H |
| 5,548,208 A | | 8/1996 | Lust | |
| 6,329,818 B1 | * | 12/2001 | Tokunaga et al. | 324/252 |
| 6,580,270 B1 | * | 6/2003 | Coehoorn | 324/252 |
| 6,636,029 B1 | | 10/2003 | Kunze et al. | |
| 7,084,617 B2 | * | 8/2006 | Ozaki et al. | 324/117 H |
| 7,583,073 B2 | * | 9/2009 | Kumar et al. | 324/117 R |
| 2004/0155644 A1 | * | 8/2004 | Stauth et al. | 324/117 R |
| 2005/0073295 A1 | | 4/2005 | Hastings et al. | |
| 2005/0156587 A1 | * | 7/2005 | Yakymyshyn et al. | 324/117 R |
| 2006/0255793 A1 | | 11/2006 | Montreuil | |
| 2007/0090825 A1 | * | 4/2007 | Shoji | 324/117 R |

FOREIGN PATENT DOCUMENTS

| | | |
|---|---|---|
| DE | 19908652 | 4/2000 |
| DE | 10054016 | 8/2002 |
| DE | 102004050019 | 6/2006 |
| DE | 10051160 | 1/2007 |
| DE | 19838536 | 2/2008 |

* cited by examiner

*Primary Examiner* — Arleen M Vazquez
(74) *Attorney, Agent, or Firm* — Dicke, Billig & Czaja, PLLC (57) ABSTRACT

A sensing system includes a conductor with a current flow path therethrough configured such that a current flowing through the conductor establishes an inhomogeneous magnetic field. A first pair of sensors is situated a first location having a first sensitivity, a second pair of sensors is situated at a second location having a second sensitivity lower than the first sensitivity. The first and second pairs of sensors are configured to measure the inhomogeneous magnetic field at their respective locations.

20 Claims, 8 Drawing Sheets

SENSOR SYSTEM AND METHOD

CROSS-REFERENCE TO RELATED APPLICATIONS

This Utility patent application is a continuation application of U.S. application Ser. No. 12/185,385, filed Aug. 4, 2008, which is incorporated herein by reference.

BACKGROUND

Sensors for detecting current flow through a conductor are known. To sense and measure the current flow, the sensors measure the magnetic field generated by the current flowing through a conductor. To achieve the desired measurements, multiple sensors with different sensitivities are often used with such known devices. Further, to adjust the sensitivity, magnetic circuits consisting of soft magnetic materials are used to modify the magnetic field strength. However, multiple sensors and/or additional magnetic materials add cost and require additional space. Further, they can cause hysteresis, remanence, temperature drift, non-linearity, reduced bandwidth, etc.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A current sensing system is disclosed in which, instead of influencing a magnetic field to be measured by permeable materials, particular conductor geometries are provided to generate an inhomogeneous field. Two or more magnetic sensors are placed at positions with different field intensities, resulting in a change in the sensitivity of the sensor and increasing dynamic range. The signals of the sensors can be simply added (by a series connection) or combined by analog or digital signal processing. In addition, sensor elements with different sensitivities can be used in order to further enhance the dynamic range. Thus, an inhomogeneous gradient magnetic field generated by current conductors is used to realize current sensors with a high dynamic range.

Figure 1:
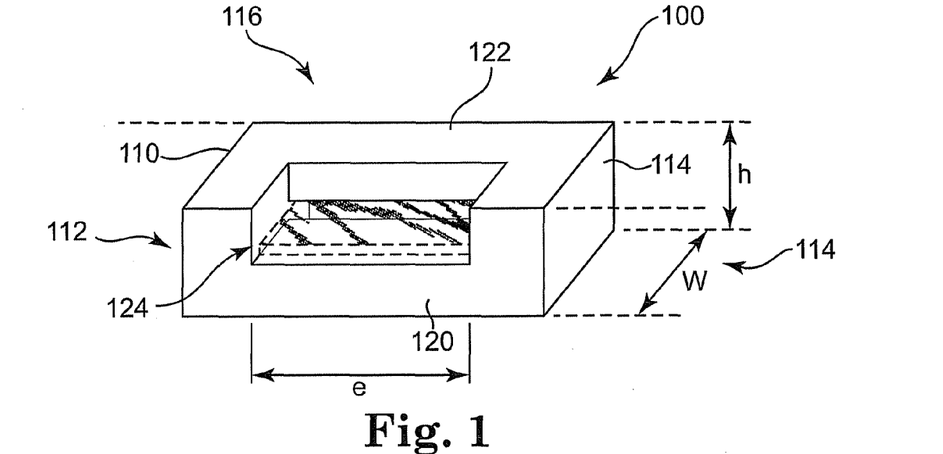
FIG. 1 is a perspective view illustrating a current sensor including an embodiment of a conductor as disclosed herein.

FIG. 1 illustrates an embodiment of a magnetic sensing system 100. A conductor 110 includes a current input end 112 and a current output end 114, which defines a current flow path 116 from the current input end 112 to the output end 114. Aluminium or copper, for example, are suitable materials for the conductor 110. The conductor 110 has a varying cross section, such that for example, one location 120 has a first cross-sectional area and another location 122 has a larger second cross-sectional area. In the embodiment illustrated in FIG. 1, the varying cross sectional area results from an opening, such as a notch 124 formed in the conductor 110. Thus, a current flowing through the conductor 110 establishes magnetic field lines having strengths that vary due to the varying cross-sectional area of the conductor, resulting in an inhomogeneous magnetic field.

Figure 2:
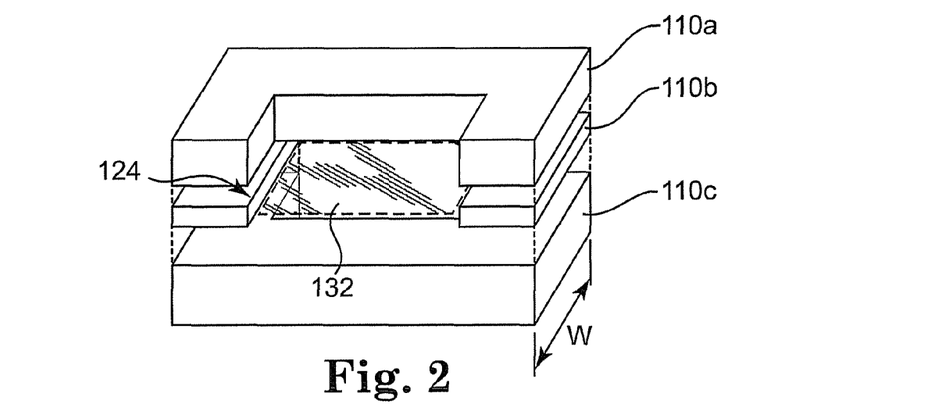
FIG. 2 illustrates an embodiment of the conductor illustrated in FIG. 1 made of several parts.

The conductor 110 illustrated can be constructed using multiple parts, as illustrated in FIG. 2, which uses three components 110a, 110b and 110c that can be formed by a standard stamping process. The particular dimensions of the conductor 110 will vary depending on the application. Typical height h and width w dimensions in some embodiments are about 5 mm and about 8 mm, respectively.

A plurality of sensors 130 are situated proximate locations of the sensor having different cross-sectional areas, such as the locations 120 and 122. The sensors 130 are configured to measure the magnetic field lines of the inhomogeneous field at their respective locations. The sensors 130 typically are mounted to a substrate and packaged, resulting in a sensor package 132. In the embodiment illustrated in FIG. 2, the chip package 132 can be placed between components forming the conductor 110. In some embodiments, the middle component 110b is a leadframe for a sensor chip, in which case an insulator is situated between each of the components 110a, 110b, 110c.

Figure 3:
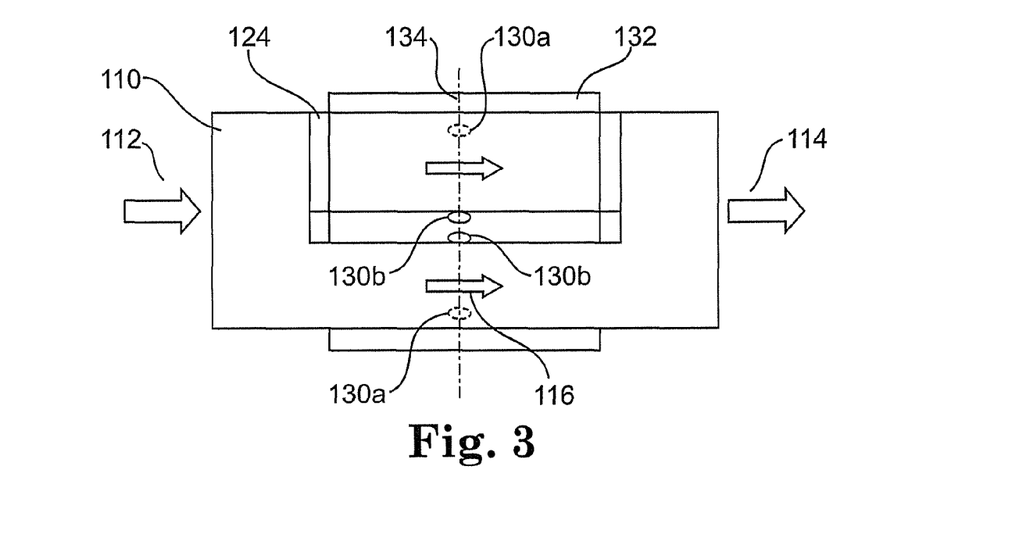
FIG. 3 is a top view of the embodiment illustrated in FIG. 1.
Figure 4:
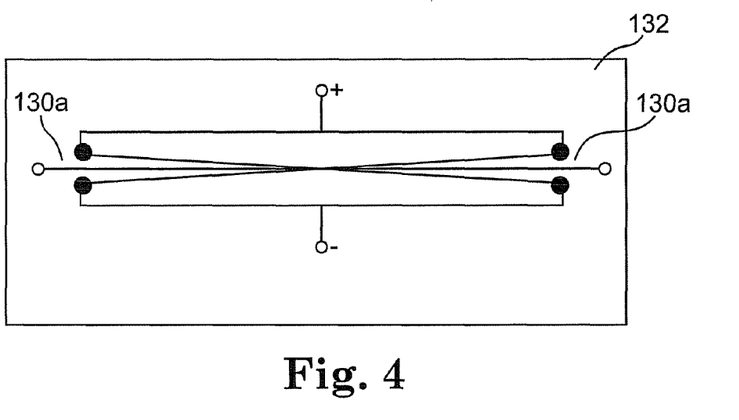
FIG. 4 is a schematic diagram of a wheatstone bridge.

FIG. 3 illustrates sensor placements used in example embodiments. In FIG. 3, four sensors 130a and 130b are illustrated. However, since differential measurements are typically used, each of the ovals representing the sensors 130 is actually a pair of sensors, where corresponding pairs of sensors, such as the sensors 130a, form the legs of a bridge circuit such as in the example wheatstone bridge circuit illustrated in FIG. 4. In the embodiment shown in FIG. 3, some of the sensors are situated in the notch, with the sensors 130a at the lower portion of FIG. 3 covered by the conductor 110, while the sensors at the upper part of the drawing (both sensors 130b and the upper sensor 130) have at least a portion of the sensor exposed.

Figure 5:
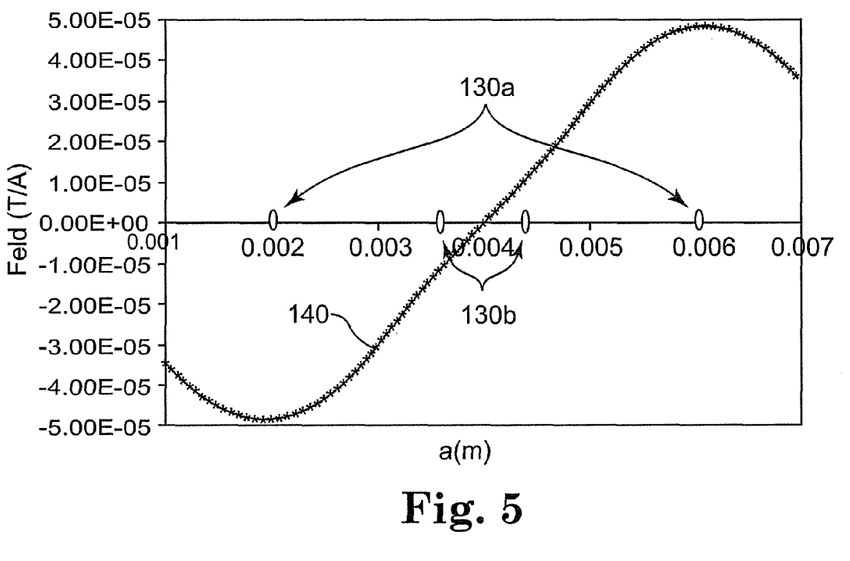
FIG. 5 illustrates a simulated magnetic field that would be generated by the embodiment of the conductor illustrated in FIG. 1.

The sensors 130 are situated in predetermined positions to provide a high dynamic range. In FIG. 3, the sensors 130 are situated on a line 134. FIG. 5 illustrates a simulated magnetic field 140 generated along the line 134 in the plane of the sensor package 132. The two pairs of sensors 130a are situated at high sensitivity locations. More specifically, in the illustrated embodiment, the sensors 130a are positioned at the locations of the minimum (negative peak) and maximum (positive peak) value of the magnetic field lines (towards the outer edges of the conductor 130). The other pairs of sensors 130b are situated at low sensitivity locations—between the first sensors 130a, such that the sensors 130b are in positions where the value of the magnetic field lines is greater than the minimum and less than the maximum. Further, the corresponding sensor pairs of each of the sets of sensors 130a, 130b are approximately equidistant from the zero-crossing point of the magnetic field lines. The exact positions of the sensors 130b depends on the particular application. Generally, the strength of the magnetic field (absolute value) at the high sensitivity positions (sensors 130a) is at least twice the value of the magnetic field at the location of the low sensitivity positions (sensors 130b). In some embodiments, the strength of the magnetic fields at the high and low sensitivity positions differs by a factor of 10.

Figure 6:
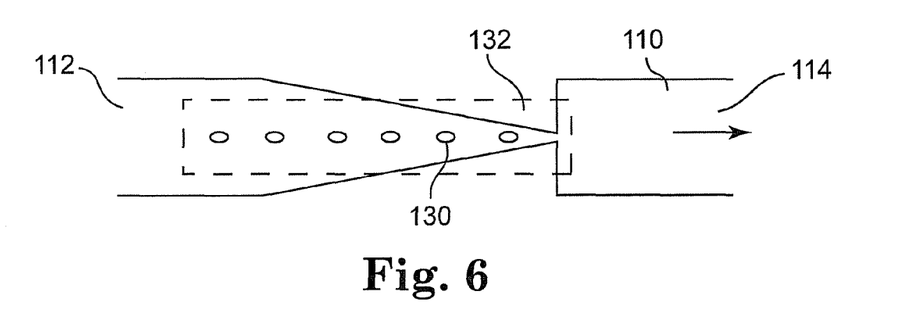
FIG. 6 illustrates a current sensor including an embodiment of a conductor as disclosed herein.
Figure 7:
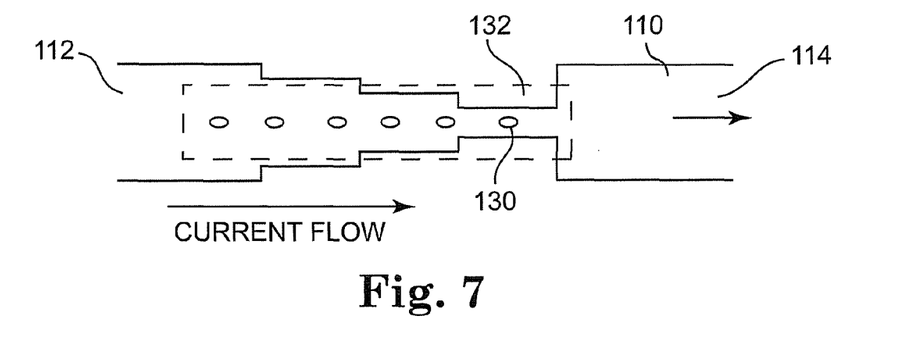
FIG. 7 illustrates a current sensor including another embodiment of a conductor as disclosed herein.
Figure 8:
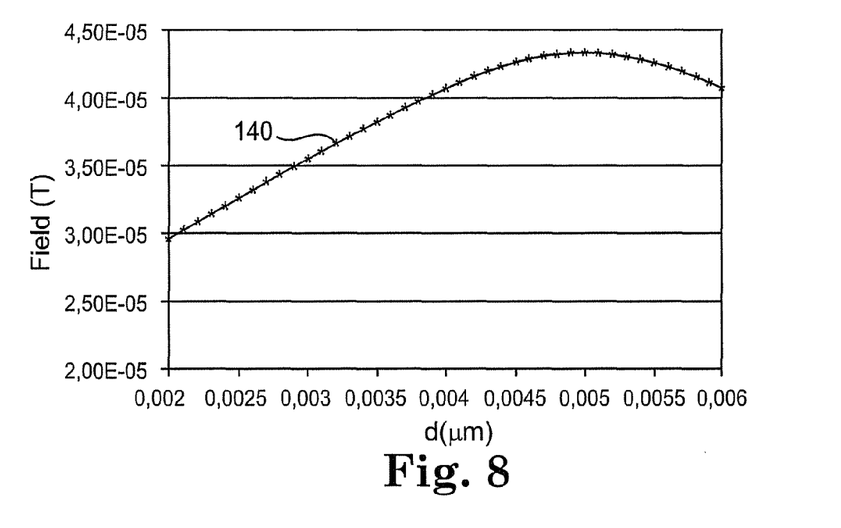
FIG. 8 illustrates a simulated magnetic field that would be generated by the embodiment of the conductor illustrated in FIG. 7.

FIGS. 6 and 7 illustrate further embodiments, where the conductor 110 has a decreasing cross-sectional area from left to right as viewed in the drawings. In both FIGS. 6 and 7, the conductor 110 is a prism with a generally square or rectangular cross-section. In FIG. 6, the cross-sectional area continuously decreases, and in FIG. 7, the cross-sectional area decreases in a stepped fashion. In both FIGS. 6 and 7, the sensor package 132 is situated next to the conductor 110, with the individual sensor pairs 130 positioned at locations of varying cross-sectional areas of the conductor 110. The magnetic field detected by the sensors 130 increases with decreasing conductor cross-sectional area. FIG. 8 illustrates a simulated magnetic field 140 for the conductor 110 shown in FIG. 7. Additionally, the sensitivities of the single sensors 130 can be varied along the portion of the conductor 130 having the varying cross-sectional area. For example, when a high sensitivity sensor is used where the magnetic field is high, and a low sensitivity sensor is used where the magnetic field is low, the whole dynamic range of the sensor system is increased.

Figure 9:
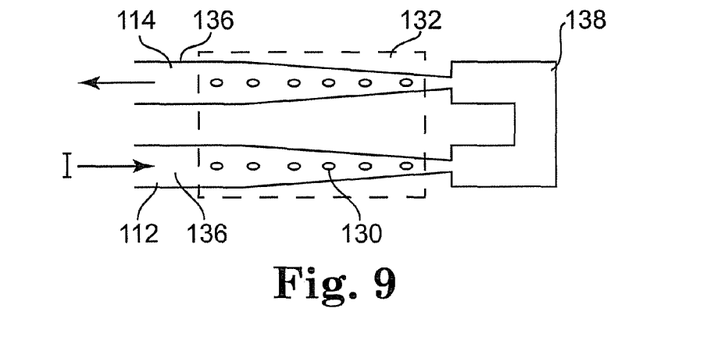
FIG. 9 illustrates a current sensor including an embodiment of a conductor as disclosed herein using a U-shaped.

In embodiments where differential measurements are desired, a U-shaped conductor 130 is used. FIG. 9 illustrates an embodiment where two legs 136 similarly shaped to the conductor 130 illustrated in FIG. 7 are connected to a U-shaped central portion 138. Thus, the current input 112 and output 114 are at the same end of the conductor 110. A sensor package 132 is positioned next to the legs 136 with sensors 130 situated to sense the magnetic field.

Figure 10A:
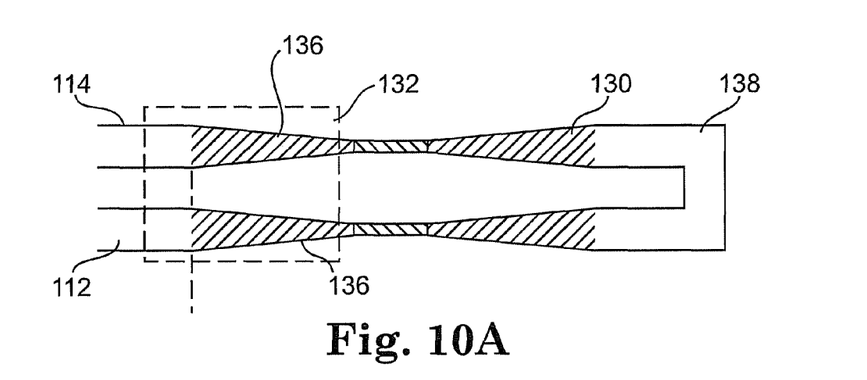
FIGS. 10A-10E illustrate embodiments of conductors as disclosed herein using a U-shaped and folded geometry.
Figure 10B:
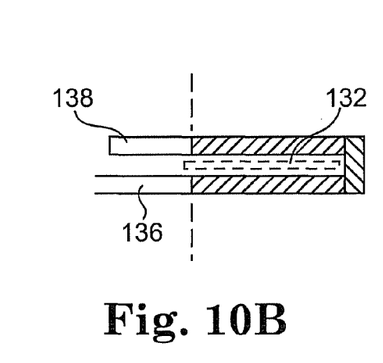
Figure 10C:
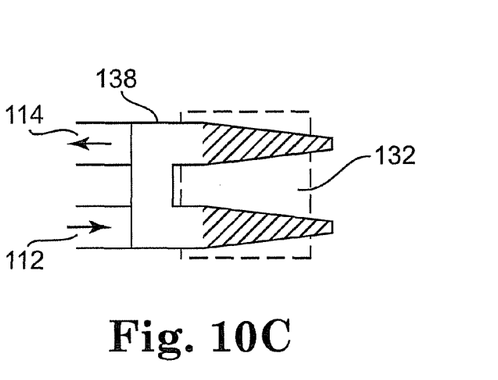
Figure 10D:
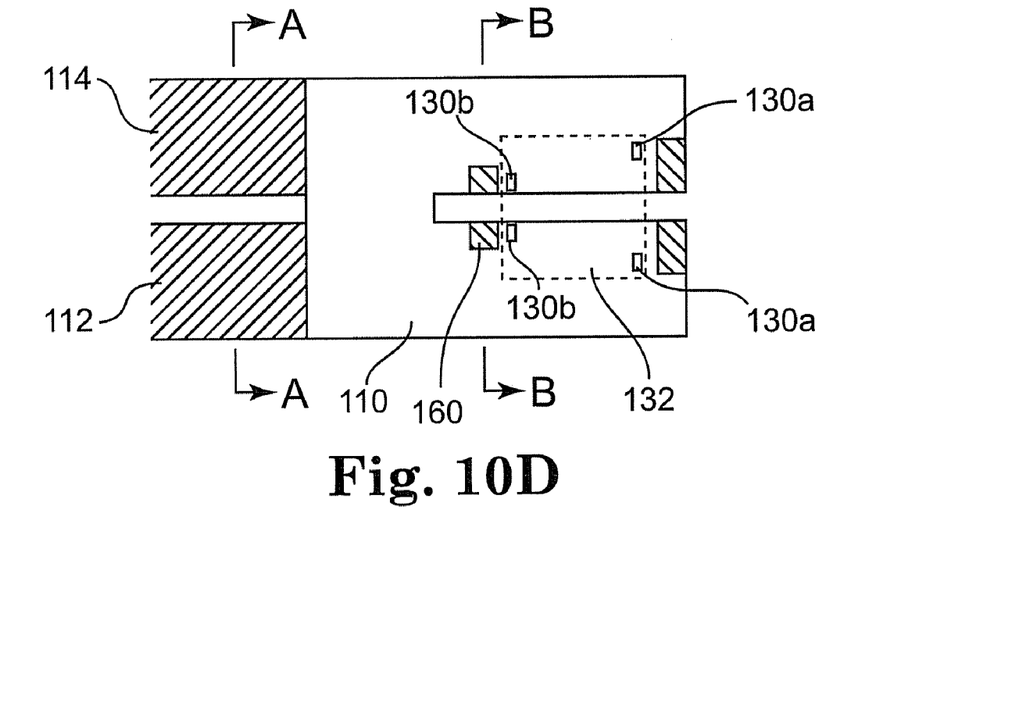
Figure 10E:
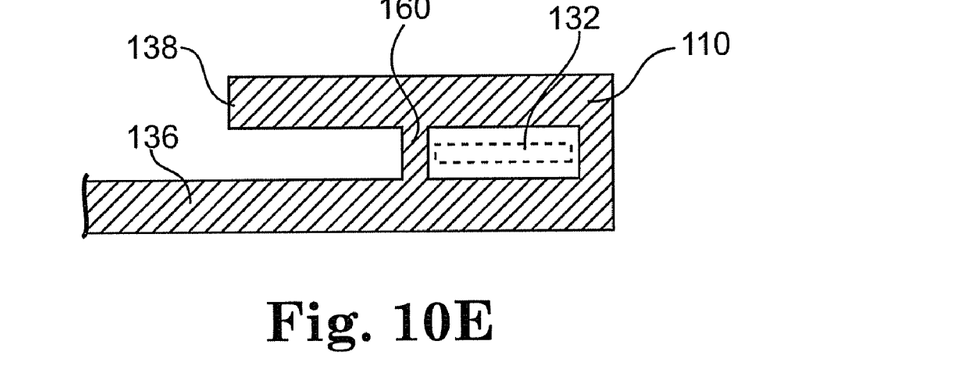

FIGS. 10A-10E illustrate additional U-shaped embodiments, where a folded construction is used. The folded geometry generates a higher maximum field and a higher gradient. FIG. 10A illustrates a top view of a U-shaped embodiment that includes portions having a decreasing cross-sectional area similar to the embodiment illustrated in FIG. 6. FIG. 10A illustrates an embodiment prior to folding the conductor 130. The U-shaped end 138 is folded over the legs 136 of the conductor 110. FIG. 10B illustrates a side view and FIG. 10C is a top view after folding the 110 of FIG. 10A. FIGS. 10D and 10E illustrate a folded embodiment with additional conductor legs 160 connecting the top and bottom sections of the folded conductor 130.

Figure 11A:
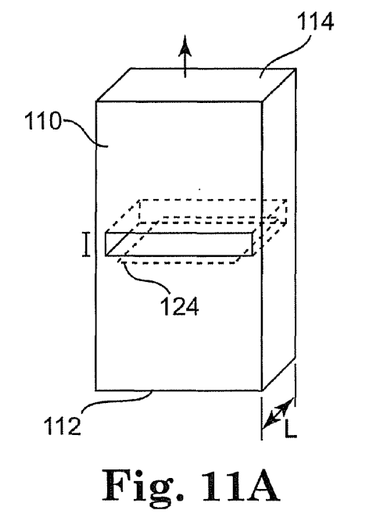
FIGS. 11A-11D illustrate a current sensor including another embodiment of a conductor as disclosed herein.
Figures 11B, 11C:
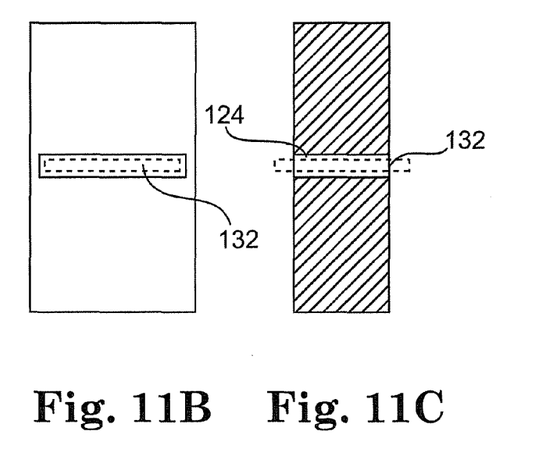
Figure 11D:
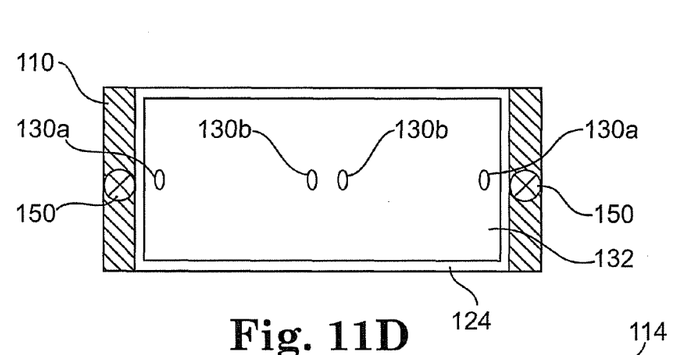

FIGS. 11A-11D illustrate another embodiment of the conductor 110 having an opening extending through the conductor. FIG. 11A is a perspective view, FIG. 11B is a front view, FIG. 11C is a cross-sectional side view and 11D is a cross sectional top view illustrating placement of sensors 130a and 130b used in an embodiment. As with the embodiment illustrated in FIG. 1, the conductor 110 illustrated in FIG. 11 includes a current input end 112 and a current output end 114 with an opening 124 extending through the conductor 110. FIG. 11D illustrates the current flow direction 150 on either side of the opening 124 (current flowing into the drawing sheet in FIG. 11D), establishing a magnetic field having a varying strength due to the varying cross-sectional area of the conductor 110 resulting in an inhomogeneous magnetic field.

Figure 12:
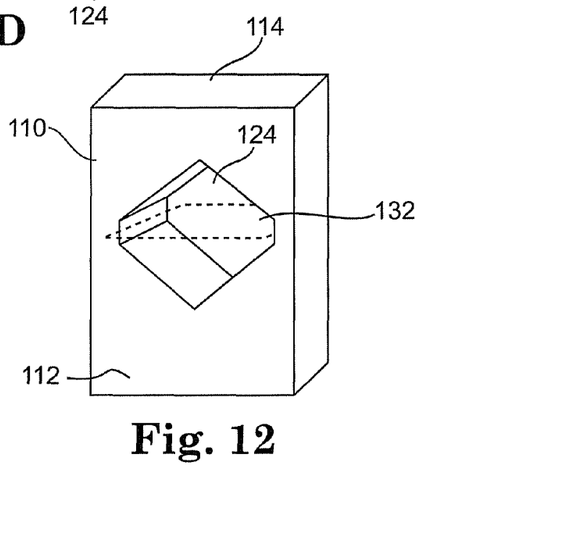
FIG. 12 illustrates a current sensor including another embodiment of a conductor as disclosed herein.
Figure 13A:
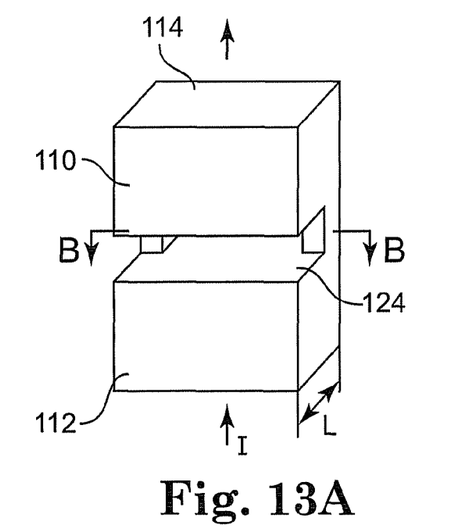
FIGS. 13A and 13B illustrate a current sensor including another embodiment of a conductor as disclosed herein.
Figure 13B:
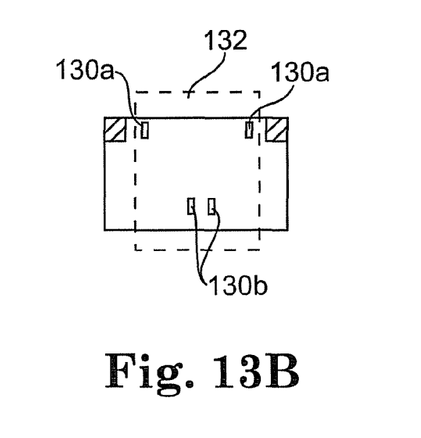
Figure 14A:
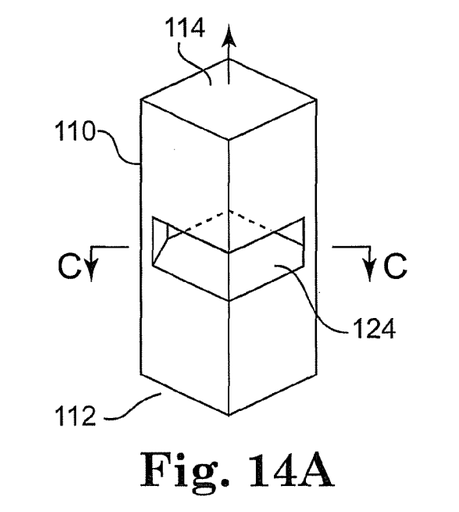
FIGS. 14A and 14B illustrate a current sensor including another embodiment of a conductor as disclosed herein.
Figure 14B:
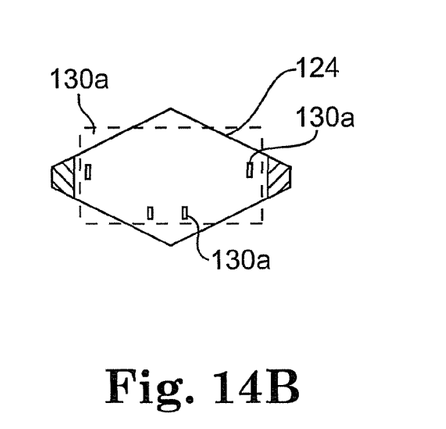

FIG. 12 illustrates an embodiment similar to that shown in FIG. 11, where the opening 124 has a different shape. The embodiment illustrated in FIG. 12 has a similar cross section to the view of FIG. 11D, and can have similar placement of the sensors 130a and 130b. FIGS. 13 and 14 illustrate additional embodiments having different configurations of the opening 124. FIGS. 13B and 14B illustrate cross-sectional views taken through the openings 124 of the respective embodiments illustrated in FIGS. 13A and 13B. FIGS. 13B and 14B illustrate example positioning of the sensors 130a and 130b.

Figure 15:
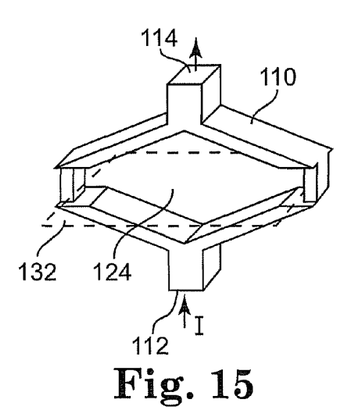
FIG. 15 illustrates a current sensor including another embodiment of a conductor as disclosed herein.
Figure 16A:
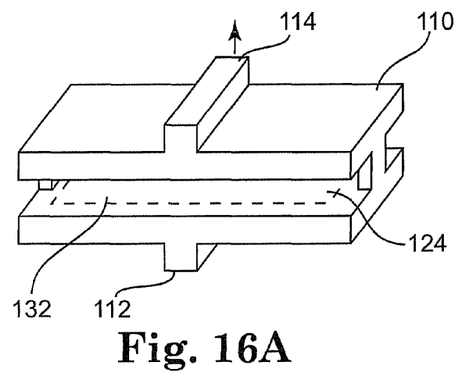
FIGS. 16A and 16B illustrate a current sensor including another embodiment of a conductor as disclosed herein.
Figure 16B:
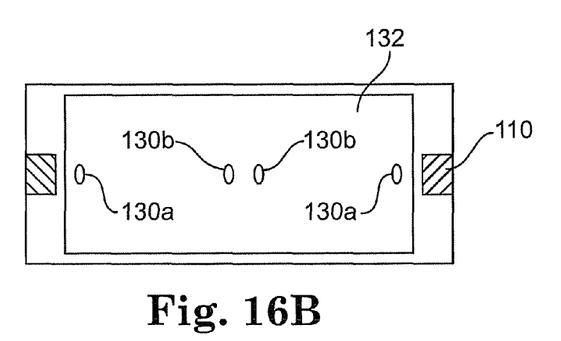
Figure 17:
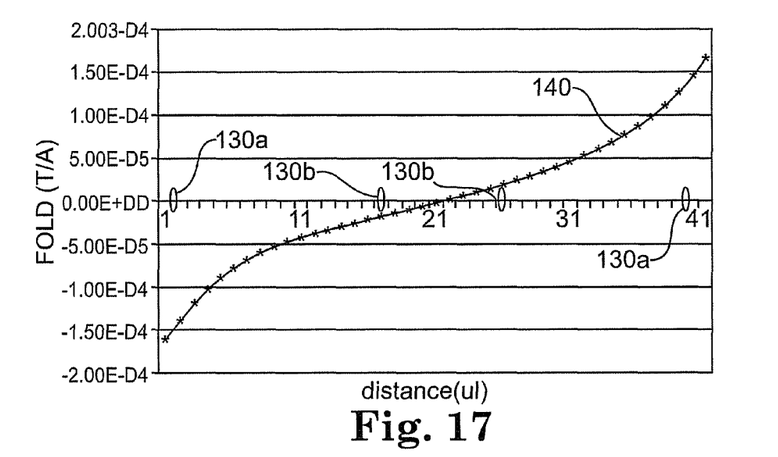
FIG. 17 illustrates a simulated magnetic field that would be generated by the embodiment of the conductor illustrated in FIG. 16.

FIGS. 15 and 16 illustrate embodiments having further conductor geometries. The embodiments illustrated in FIGS. 15 and 16 have openings 124 therein, and also define locations having different cross sectional areas. FIG. 17 illustrates a simulated magnetic field 140 for the embodiment illustrated in FIG. 16. As with other disclosed embodiments, the sensors 130a are positioned at high sensitivity areas, where the magnetic field is at the negative and positive peaks. FIG. 16A is a cross-sectional view of the conductor 110 illustrated in FIG. 16A, illustrating placement of the sensors 130a and 130b within the opening 124. In the configuration of FIG. 16, the portion of the curve 140 near the center is fairly flat and nearly linear. Thus, the positioning of the sensors 130b is not particularly critical. The positioning of the sensors 130a, however, needs to be more precise. Since the value of the magnetic field is high, errors in positioning the sensors 130a can result in more influence on a system employing the conductor 110.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic sensing system, comprising:
   a conductor configured such that a current flowing through the conductor establishes an inhomogeneous magnetic field;
   a first pair of sensors situated at a first location of the conductor having a first sensitivity; and
   a second pair of sensors situated at a second location of the conductor having a second sensitivity lower than the first sensitivity;
   the first and second pairs of sensors being configured to measure the inhomogeneous magnetic field at their respective locations.

2. The magnetic sensing system of claim 1, wherein the conductor has a first cross-sectional area at the first location and a second cross-sectional area at the second location, wherein the inhomogeneous magnetic field has magnetic field lines with strengths that vary according the conductor cross-sectional area.

3. The magnetic sensing system of claim 1, wherein the conductor has an opening therein, and wherein at least one of the sensors is situated in the opening.

4. The magnetic sensing system of claim 1, wherein the first and second pairs of sensors form legs of a bridge circuit.

5. The magnetic sensing system of claim 1, wherein the inhomogeneous magnetic field has magnetic field lines with strengths that vary, and wherein the magnetic field lines are at a maximum at the first location and the magnetic field lines are at a minimum at the second location.

6. The magnetic sensing system of claim 1, wherein the conductor has a section with a continuously decreasing cross-sectional area.

7. The magnetic sensing system of claim 1, wherein the conductor has a section where the cross-sectional area decreases in a stepped fashion.

8. The magnetic sensing system of claim 1, wherein the conductor is generally U-shaped.

9. The magnetic sensing system of claim 1, further comprising third and forth pairs of sensors, wherein:
   the third and fourth pairs of sensors are situated at locations where the value of the magnetic field lines are greater than the minimum and less than the maximum; and
   the third and fourth pairs of sensors are situated at locations approximately equidistant from a location where the magnetic field lines are zero.

10. The magnetic sensing system of claim 1, wherein the sensors are situated on a common plane.

11. The magnetic sensing system of claim 1, wherein the sensors are mounted to a substrate.

12. A method of producing a magnetic sensor, comprising:
   forming a conductor configured such that a current flowing through the conductor establishes an inhomogeneous magnetic field, the conductor having a first location with a first sensitivity and a second location having a second sensitivity lower than the first sensitivity;
   placing first and second pairs of sensors at the first and second locations, respectively; and
   connecting the first and second pairs of sensors in a first bridge configuration.

13. The method of claim 12, wherein forming the conductor includes forming the conductor to have a first cross-sectional area and a second cross-sectional area, and wherein the first and second locations are at locations where the value of magnetic field lines formed by a current flowing through the conductor are at a maximum and a minimum, respectively.

14. The method of claim 12, wherein forming the conductor includes folding the conductor.

15. The method of claim 12, further comprising placing the sensors on a common plane.

16. The method of claim 13, further comprising:
   placing third and fourth pairs of sensors at third and fourth locations where the value of the magnetic field lines are greater than the minimum and less than the maximum, wherein the third and fourth locations are approximately equidistant from a location where the magnetic field lines are zero; and
   connecting the third and fourth pairs of sensors in a second bridge configuration.

17. A magnetic sensing method, comprising:
   applying a current to a conductor;
   providing a plurality of sensors arranged in first, second, third and fourth pairs that form legs of a bridge circuit;
   situating the first and second pairs at first and second locations to measure magnetic field lines of an inhomogeneous magnetic field at the first and second locations, the first and second locations having a first sensitivity; and
   situating the third and fourth pairs at third and fourth locations to measure magnetic field lines at the third and fourth locations, the third and forth locations having a second sensitivity lower than the first sensitivity.

18. The magnetic sensing method of claim 17, wherein a current flowing through the conductor establishes magnetic field lines, and wherein the value of magnetic field lines are at a maximum and a minimum at the first and second locations, respectively, the value of the magnetic field lines are greater than the minimum and less than the maximum at the third and forth locations, and wherein the third and fourth locations are approximately equidistant from a location where the magnetic field lines are zero.

19. The magnetic sensing method of claim 17, wherein the conductor has an opening therein, and wherein the magnetic field lines are measured at a location proximate the opening.

20. The magnetic sensing method of claim 17, wherein the sensors are situated on a common plane.

* * * * *